US007579133B2

(12) United States Patent
Yu et al.

(10) Patent No.: US 7,579,133 B2
(45) Date of Patent: Aug. 25, 2009

(54) PROCESSLESS LITHOGRAPHIC PRINTING PLATE PRECURSOR

(75) Inventors: Yisong Yu, Vancouver (CA); Brian J. Collister, Burnaby (CA); Jonathan W. Goodin, Wake Forest, NC (US); Graham Darling, Burnaby (CA); Jacqueline L. Ricafrente, Surrey (CA); Susan A. Wilkinson, Vancouver (CA)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 14 days.

(21) Appl. No.: 11/181,039

(22) Filed: Jul. 13, 2005

(65) Prior Publication Data

US 2006/0292486 A1 Dec. 28, 2006

Related U.S. Application Data

(63) Continuation-in-part of application No. 10/647,913, filed on Aug. 25, 2003.

(60) Provisional application No. 60/436,182, filed on Apr. 14, 2003.

(51) Int. Cl.

| | |
|---|---|
| ***G03F 7/038*** | (2006.01) |
| ***G03F 7/09*** | (2006.01) |
| ***G03F 7/11*** | (2006.01) |
| ***G03C 1/76*** | (2006.01) |

(52) U.S. Cl. .................... 430/273.1; 430/302; 430/330; 430/944

(58) Field of Classification Search .............. 430/270.1, 430/271.1, 273.1, 302, 434, 435, 494, 944, 430/945; 101/463.1, 465, 466, 467
See application file for complete search history.

(56) References Cited

U.S. PATENT DOCUMENTS

| | | | | |
|---|---|---|---|---|
| 4,081,572 | A | 3/1978 | Pancansky | |
| 4,634,659 | A | 1/1987 | Esumi et al. | |
| 5,569,573 | A * | 10/1996 | Takahashi et al. | 430/138 |
| 5,958,514 | A | 9/1999 | Havey et al. | |
| 6,096,471 | A | 8/2000 | Van Damme et al. | |
| 6,110,645 | A | 8/2000 | DeBoer et al. | |
| 6,410,202 | B1 | 6/2002 | Fleming et al. | |
| 6,513,433 | B2 | 2/2003 | Inoue et al. | |
| 6,528,237 | B1 | 3/2003 | Leenders et al. | |
| 6,653,042 | B1 * | 11/2003 | Fukino et al. | 430/270.1 |
| 6,821,566 | B2 | 11/2004 | Nakamura et al. | |
| 2004/0031408 | A1 * | 2/2004 | Makino | 101/453 |
| 2004/0081911 | A1 * | 4/2004 | Noglik et al. | 430/270.1 |
| 2006/0073418 | A1 * | 4/2006 | Wilkinson et al. | 430/302 |

FOREIGN PATENT DOCUMENTS

| | | | |
|---|---|---|---|
| EP | 0925916 | A1 | 6/1999 |
| EP | 0949088 | A1 | 10/1999 |
| EP | 1057622 | A2 | 12/2000 |
| EP | 1108534 | A1 | 6/2001 |
| EP | 2001162961 | | 6/2001 |
| EP | 1 145 848 | A2 * | 10/2001 |
| EP | 1338435 | A2 | 8/2003 |

* cited by examiner

*Primary Examiner*—Sin J. Lee
(74) *Attorney, Agent, or Firm*—J. Lanny Tucker

(57) ABSTRACT

A radiation-sensitive medium comprises hydrophilic polymer particles, the particles comprising a thermally softenable hydrophobic polymer, a hydrophilic polymer and a bonding compound capable of chemically bonding to the hydrophobic polymer and to the hydrophilic polymer. The radiation-sensitive medium further may comprise a substance capable of converting radiation into heat. The radiation-sensitive medium is aqueous-ineluable when coated and dried, and becomes hydrophobic under the action of heat. The polymer particles are made by polymerization of at least one hydrophobic monomer and at least one bonding compound in the presence of the hydrophilic polymer. The radiation-sensitive medium may be provided as a coatable composition to be applied to substrates to form a processless radiation-imageable lithographic printing precursor, which may further be provided with an aqueous eluable hydrophilic overcoat. The processless radiation-imageable lithographic printing precursor so created may be imaged using absorbed radiation that is imagewise converted to heat, resulting in areas of hydrophobic property, while unimaged areas retain their hydrophilic property. This allows the latent image so formed to be employed in creating a negative-working lithographic printing master. The negative-working lithographic printing master so created is irreversible, does not require a substrate of controlled hydrophilicity and provides great toughness in the exposed areas. The radiation-sensitive medium may be coated on-platesetter or on-press onto a suitable substrate, including the drum of the press. It may also be coated off-press on a suitable substrate to create a precoated processless radiation-imageable lithographic printing precursor.

18 Claims, No Drawings

PROCESSLESS LITHOGRAPHIC PRINTING PLATE PRECURSOR

CROSS-REFERENCE TO RELATED APPLICATIONS

This application claims the benefit of provisional application No. 60/436,182 filed on Apr. 14, 2003, and is a continuation-in-part of application Ser. No. 10/647,913, filed Aug. 25, 2003.

FIELD OF THE INVENTION

This invention relates to image formation in printing plates and printing plate precursors and to the formation of images directly from electronically composed digital sources without wash-off development.

BACKGROUND OF THE INVENTION

For many years, it has been a goal of the printing industry to form printing images directly from an electronically composed digital database, for example, by a so-called "computer-to-plate" system. The advantages of such a system over the traditional methods of making printing plates are the elimination of the costly intermediate silver-containing film and processing chemicals; a saving of time; and the ability to automate the system with consequent reduction in labor costs.

The introduction of laser technology provided the first opportunity to form an image directly on a printing plate precursor by directing a laser beam at sequential areas of the printing plate precursor and modulating the beam so as to vary its intensity. In this way, radiation sensitive plates comprising a high sensitivity photocrosslinkable polymer coating have been exposed to imagewise distributions of radiation from various laser sources and electrophotographic printing plate precursors having sensitivity ranging from the visible spectral region into the near infra-red region (including thermal sensitivity) have been successfully exposed using low powered air-cooled argon-ion lasers and semiconductor laser devices.

While lithographic printing precursors that are post-exposure developable using aqueous media, preferably alkaline aqueous media, are well known and widely used in the printing industry, there is a more specific subset of precursors that may be developed on press by the action of the fountain solution employed during wet offset printing. A newer class of lithographic media is based upon the general concept of employing polymeric particles in an otherwise hydrophilic binder, often along with a substance to convert light into heat. This kind of media is exemplified by U.S. Pat. No. 6,001,536. The unilluminated areas of a lithographic precursor based on this generic media may be removed by treatment with fountain solution on a printing press. This kind of precursor is therefore pseudo-processless, in that no specific separate development step with a specific developer, as such, is required to obtain a master. The illuminated areas are rendered hydrophobic and hence the master is in effect negative-working. These precursors allow lithographic printing masters to be made relatively easily on-press, but suffer from poor run length. The quality of the printed image rendered is directly dependent on the choice and quality of hydrophilic substrate used, as this substrate is exposed and has to carry the fountain solution during the wet offset printing process.

A more specific category of lithographic precursors employs mechanisms and compositions that cause the sensitive layer on the substrate to switch between hydrophilic and hydrophobic, without any material being required to be removed with a development step. That is, there is no removal of material at all, even by fountain solution. These are true processless precursors.

By way of example, U.S. Pat. No. 6,410,202 describes a composition for thermal imaging comprising a hydrophilic heat-sensitive polymer having recurring ionic groups within the polymer backbone or chemically attached thereto. The imaging members of this particular invention do not require post-imaging wet processing and are generally negative-working in nature. In some cases, the polymers are crosslinked upon exposure and provide increased durability to the imaging members. In other and preferred cases, the polymers are crosslinked upon application to a support and curing. A further example of this class of precursor is provided by U.S. Pat. No. 5,985,514. That patent describes an imaging member that is composed of a hydrophilic imaging layer having a hydrophilic heat-sensitive polymer containing heat-activatable thiosulfate groups, and optionally a photothermal conversion material. Upon application of energy that generates heat, such as from IR irradiation, the polymer is crosslinked and rendered more hydrophobic. The exposed imaging member can be contacted with a lithographic printing ink and a fountain solution and used for printing with or without post-imaging wet processing. U.S. Pat. No. 4,081,572 describes making hydrophilic printing masters comprising coating a self-supporting master substrate with a specific hydrophilic polymer containing carboxylic acid functionality and selectively converting this polymer in image configuration to a hydrophobic condition by heat. The polymer is selectively converted to a hydrophobic condition in image configuration through heat-induced cyclodehydration reactions. In other examples the precursor is inherently positive-working, as in the case of U.S. Pat. No. 4,634,659. That particular patent describes a method of making a processing-free planographic printing plate comprising irradiating a plate surface comprised of a hydrophobic organic compound capable of being converted, upon exposure to radiation, from hydrophobic to hydrophilic, carrying out the exposure in an image pattern, thereby selectively converting said surface, in the image pattern, from hydrophobic to hydrophilic, thereby making the precursor positive-working.

A yet more specific category of true processless lithographic precursors, is based on media comprising polymer-based particles or microcapsules:

In U.S. Pat. No. 6,550,237 a heat-sensitive material is described for making a negative working non-ablative lithographic printing plate including in a heat sensitive layer thermoplastic polymer beads and a compound capable of converting light into heat on a surface of a hydrophilic metal support. The layer is free of binder, and is characterized in that the thermoplastic polymer beads have a diameter between 0.2 μm and 1.4 μm. Argument is provided for the requirement that the thermoplastic particles should have a specific size range. It is explained that, when the polymer particles are subjected to a temperature above the coagulation temperature they coagulate to form a hydrophobic agglomerate so that at these parts the metallic support becomes hydrophobic and oleophilic. Preferably, the polymer particles are selected from the group consisting of polyvinyl chloride, polyvinylidene chloride, polyacrylonitrile, polyvinyl carbazole etc., copolymers or mixtures thereof. Most preferably used are polystyrene, polyacrylate or copolymers thereof and polyesters or phenolic resins. No indication is given that the polymer particles should be hydrophilic, or that there may be more than one polymer in the particles.

In U.S. Pat. No. 6,653,042, a lithographic printing plate precursor requiring no development step is described. It comprises a support, having provided thereon a layer comprising a hydrophilic medium, wherein the layer comprising a hydrophilic medium contains a hydrophobitization precursor having a hydrophilic surface and a light/heat converting agent which is hydrophilic in itself, or at least on the surface. Various implementations of the invention are presented in which the hydrophobitization precursor having a hydrophilic surface is a particle dispersion of composite constitution containing a hydrophobic substance at the core part and having a surface layer of specifically superficial hydrophilicity. All forms of particles disclosed are composed of either one or two distinct materials. Various materials may be at the core, including hydrophobic polymeric materials and crosslinking materials. A light-to-heat converting material, which is specifically chosen to be hydrophilic, is also added. The lithographic printing plate precursor as described above, further comprises a water-soluble protective layer.

U.S. Pat. Nos. 5,569,573 and 6,171,748 describe a thermosensitive lithographic printing original plate comprising a substrate, a hydrophilic layer containing a hydrophilic binder polymer, and a microcapsuled oleophilic material which forms an image area by heating; the hydrophilic binder polymer having a three-dimensional cross-link and a functional group which chemically combines with the oleophilic material in the microcapsule when the microcapsule is ruptured, and the microcapsuled oleophilic material having a functional group which chemically combines with the hydrophilic binder polymer when the microcapsule is ruptured. Among the many hydrophilic binder polymers listed are polysaccharides. The lithographic printing plate has a hydrophilic polymer thin film layer on the surface of the hydrophilic layer. This hydrophilic thin film layer inhibits the surface from accepting tinting materials.

United States patent U.S. Pat. No. 6,513,433 (Inoue et al.) provides a lithographic printing plate precursor comprising a hydrophilic support having thereon a heat-sensitive layer containing a thermoplastic particulate polymer having Tg of not lower than 60° C., and at least one of a particulate polymer having a heat-reactive group and a microcapsule containing a compound having a heat-reactive group incorporated therein. The lithographic printing plate precursor of U.S. Pat. No. 6,513,433 further comprises a water-soluble overcoat layer provided on the heat-sensitive layer. Inoue et al. theorize that when subjected to heat mode exposure, the lithographic printing plate precursor according to the invention undergoes heat reaction of the microcapsules containing a particulate polymer having a heat-reactive group or a compound having a heat-reactive group incorporated in the heat-sensitive layer to enhance the strength on the image area and hence provide an excellent impression capacity. It is also thought that the thermoplastic particulate polymer which has once been melted becomes solidified when the temperature returns to ordinary value after exposure, whereby the strength can be further enhanced on the image area which has been exposed in a heat mode, providing better impression capacity.

U.S. Pat. Nos. 5,677,108, 5,677,110 and 5,997,993 disclose an on-press developable lithographic printing plate precursor comprising a lithographic hydrophilic printing plate substrate, a photohardenable photoresist, and a layer of polymeric protective overcoat. The overcoat functions as an oxygen barrier, as well as imparting the plate with a non-tacky surface and an enhanced resistance to the adverse influence of ambient humidity. The overcoat contains a polyphosphate salt and may further contain a fountain soluble or dispersible crystalline compound to facilitate on-press removability.

United States Patent U.S. Pat. No. 6,387,595 discloses an on-press developable lithographic plate comprising on a substrate a photosensitive layer and a top ultra-thin ink and/or fountain solution soluble or dispersible overcoat with coverage of 0.001 to 0.150 g/$m^2$.

Heat-sensitive lithographic printing plates not requiring a wet development step after exposure have been desired by the industry for a long time. One approach to no-process lithographic printing plates relies on ablation to physically remove the imaging layer from the printing plate precursor. Unfortunately, ablative printing plates can only be exposed on imaging devices that are fitted with a vacuum device to collect the by-products of the ablative imaging step (particulate and gaseous debris). Recently the use of a laser transparent, water-soluble top coating over an ablatable imaging layer such that when ablatively removed with a laser, the ablative debris is contained by the top coating, has been proposed. See for example WO99/41077, U.S. Pat. Nos. 6,397,749, 6,468,717 and 6,468,717.

A water-soluble overcoat may also be provided to protect the hydrophilic layer during storage and handling and to improve lithographic latitude. See for example U.S. Pat. Nos. 5,997,993, 6,171,748, 6,468,717, 6,503,684 and 6,513,433.

There remains a requirement for negative-working, true processless, lithographic precursors having long run-length, suitable sensitivity to laser-diode-based imaging radiation, and which are easy to prepare, preferably from aqueous media, and show consistent high quality press performance and good handling characteristics.

SUMMARY OF THE INVENTION

A radiation-sensitive medium comprises hydrophilic polymer particles, the particles comprising a thermally softenable hydrophobic polymer, a hydrophilic polymer and a bonding compound capable of chemically bonding to the hydrophobic polymer and to the hydrophilic polymer.

The radiation-sensitive medium further may comprise a substance capable of converting radiation into heat. The radiation-sensitive medium is aqueous-ineluable when coated and dried, and becomes hydrophobic under the action of heat. The polymer particles are made by polymerization of at least one hydrophobic monomer and at least one bonding compound in the presence of the hydrophilic polymer. The radiation-sensitive medium may be provided as a coatable composition to be applied to substrates to form a processless radiation-imageable lithographic printing precursor, which may further be provided with an aqueous eluable hydrophilic overcoat. The processless radiation-imageable lithographic printing precursor so created may be imaged using absorbed radiation that is imagewise converted to heat, resulting in areas of hydrophobic property, while unimaged areas retain their hydrophilic property. This allows the latent image so formed to be employed in creating a negative-working lithographic printing master. The negative-working lithographic printing master so created is irreversible, does not require a substrate of controlled hydrophilicity and provides great toughness in the exposed areas. The radiation-sensitive medium may be coated on-platesetter or on-press onto a suitable substrate, including the drum of the press. The radiation-sensitive medium of the present invention may be coated off-press on a suitable substrate to create a precoated processless radiation-imageable lithographic printing precursor.

DETAILED DESCRIPTION OF THE INVENTION

In a first aspect of the invention there is provided a radiation-sensitive medium comprising hydrophilic polymer particles, the particles comprising a thermally softenable hydrophobic polymer, a hydrophilic polymer and a bonding compound capable of chemically bonding to the hydrophobic polymer and to the hydrophilic polymer. The radiation-sensitive medium further may comprise a substance capable of converting radiation into heat. The radiation-sensitive medium is aqueous-ineluable when coated and dried, and becomes hydrophobic under the action of heat.

In a further aspect of the invention there is provided a method for making the radiation-sensitive medium of the invention by polymerization of at least one hydrophobic monomer and at least one bonding compound in the presence of the hydrophilic polymer.

In a further aspect of the invention, there is provided a precoated processless radiation-imageable lithographic printing precursor, comprising a first layer of the radiation-sensitive medium of the present invention, precoated onto a substrate and dried, and an aqueous eluable hydrophilic overcoat, comprising at least one hydrophilic polymer, precoated and dried onto the first layer.

In a further aspect of the invention there is provided a method for making a precoated processless radiation-imageable lithographic printing precursor, comprising the coating of the radiation-sensitive medium of the invention onto a substrate and drying the coated radiation-sensitive medium, followed by the coating and drying of a aqueous eluable hydrophilic overcoat, comprising at least one hydrophilic polymer.

In yet a further aspect of the invention there is provided a method for making a negative working lithographic printing master using the precoated processless radiation-imageable lithographic printing precursor. The precoated processless radiation-imageable lithographic printing precursor may be imaged using absorbed radiation that is imagewise converted to heat, transforming hydrophilic areas to hydrophobic areas, resulting in areas of hydrophilic and areas of hydrophobic property. This allows the latent image so formed to be employed in making a negative-working lithographic printing master. The imaging process is irreversible when performed. That is, the coated and dried radiation-sensitive medium remains hydrophobic after imagewise exposure to imaging radiation. The method may be performed on a platesetting machine or fully on-press.

Definitions:

The term "negative-working lithographic printing master" is used herein to describe a lithographic printing master on which, during the process of transferring printing ink from the master to a printing medium for receiving printing ink, the printing ink adheres to those areas that were irradiated or written to in any way whatsoever by an imaging head and, conversely, on which printing ink does not adhere to those areas that were not irradiated or written to in any way by that imaging head. Whether the master is referred to as negative-working or positive-working is therefore not determined by the means of creating ink-bearing and non-ink-bearing areas on the master, but rather by whether the positive image to be created on the printing medium for receiving the printing ink, or the negative of it, respectively, is transferred to the master from the imaging head. In brief, on a "negative-working lithographic printing master", those areas that are written by the imaging head will carry printing ink.

The phrase "processless radiation-imageable lithographic printing precursor" is used herein to describe a radiation-imageable lithographic printing precursor that requires no imagewise removal of, or imagewise addition to, any part of the precursor after imagewise exposure of the precursor to radiation in order to form a lithographic printing master.

The phrase "precoated processless radiation-imageable lithographic printing precursor" is used herein to describe a processless lithographic printing precursor that comprises a radiation-sensitive medium coated onto a substrate.

Substrates may specifically include printing press drums or sleeves, the drums or sleeves being precoated with radiation-sensitive medium, or with radiation-sensitive medium and an adhesion-promoting layer.

The term "eluent" refers to any fluid, either liquid or gaseous, which is capable of dissolving or otherwise placing the unpatterned coating of the radiation-sensitive medium into a dispersible form.

The term "dispersible" means, with respect to a layer of given material, that the material is capable of displacement or removal, including lifting off, by physical or chemical action of a fluid.

The term "aqueous eluable" is used to describe a property of an overcoat layer coated over a aqueous ineluable radiation-sensitive layer, whereby the hydrophilic overcoat layer, but not the aqueous ineluable radiation-sensitive layer, is removable by dissolving and/or dispersing it in an aqueous medium like water or fountain solution as used on printing presses.

The term "aqueous-ineluable" is used to describe a property of a radiation-sensitive medium coated on a substrate, whereby the radiation-sensitive medium is not dissolved or otherwise dispersible by an aqueous eluent. It must be remembered that nearly any material may be etched or dissolved, so that this term applies only to fluids that are intended to be used in the treatment of the layer (e.g., water, low alkaline content aqueous solutions, acidic solutions, aqueous solutions with low amounts of organic compounds such as 10% isopropanol or methoxypropanol, and other fountain solutions used on printing presses.)

The term saccharide is used herein as defined by IUPAC, being inclusive of monosaccharides and di-, oligo- and polysaccharides, the di-, oligo- and polysaccharides being made up of a plurality of monosaccharide units linked to each other by a glycosidic bond.

Composition of the Radiation-Sensitive Medium

In a first embodiment of the present invention, a radiation-sensitive medium comprises a continuous phase and hydrophilic polymer particles. The hydrophilic polymer particles comprise a thermally softenable hydrophobic polymer, a hydrophilic polymer and a bonding compound capable of chemically bonding to the hydrophobic polymer and to the hydrophilic polymer. The polymer particles are made by polymerization of at least one hydrophobic monomer and at least one bonding compound in the presence of the hydrophilic polymer. The radiation-sensitive medium of the present invention, when coated and dried, is aqueous-ineluable and a layer of the radiation-sensitive medium becomes hydrophobic when imaged using absorbed radiation that is imagewise converted to heat. A substance capable of converting radiation into heat is preferably added to the composition to create a suitably radiation-sensitive medium.

The hydrophilic polymer particles are hydrophilic to a substantial depth, with only a core region of the particles being hydrophobic. A "substantial depth" means a depth that is sufficiently large that when a lithographic printing master made from a coated precursor in accordance with the invention is employed in printing, the hydrophilic areas of the coating will not erode sufficiently to expose the hydrophobic core of the particles and thereby detrimentally affect printing quality to a material degree. Being hydrophilic to a substantial depth stands in contrast to the various particle types discussed in patent U.S. Pat. No. 6,653,042, which are either entirely hydrophilic or have only a superficial hydrophilic surface region or coating. The polymer particles of the present invention are distinctly hydrophilic, compared with the hydrophobic particles disclosed in U.S. Pat. No. 6,550,237. The hydrophilic particles are also to be contrasted with the materials disclosed in U.S. Pat. No. 5,569,573 (Takahashi et al.) and EP 0 949 088 A1 (Tanaka et al.) which are both microcapsuled materials. Without wishing the invention to be limited in any way, the inventors believe that the cores of the particles are dominated by the hydrophobic polymer derived from the hydrophobic monomer, while the rest of any given particle is dominated by the hydrophilic polymer. It is believed that there is a transition region wherein there are co-polymers of both the hydrophobic monomer and the hydrophilic polymer with the bonding compound (itself preferably hydrophilic as a polymer), producing thereby a particle that has three regions, namely, an inner hydrophobic core, a transition region that is largely hydrophilic, due to the nature of the preferred bonding compounds, and the rest of the particle, being dominated by the hydrophilic polymer.

The hydrophobic monomer of the present invention is selected from electrically neutral ethylenically unsaturated monomers such as ethylene, propylene, styrene, other vinyl monomers (e.g. methyl methacrylate), and electrically neutral derivatives of these ethylenically unsaturated monomers. The term "electrically neutral" is well understood in the art and includes primarily non-polar compounds, although monomers with internal charge distributions and overall electrical neutrality (e.g., Zwitterions) are acceptable.

The bonding compound of the present invention is preferably selected from within the classes of water-soluble/dispersible ethylenically unsaturated monomers, especially acryloyl or methacryloyl monomers and anionic-substituted styrene monomers, and especially acryloyl acids (i.e., acrylic acid, and methacrylic and other substituted acrylic acids) and sulfonated or phosphonated styrenes (e.g., with alkali or alkaline metal or ammonium counterions such as Na, Li, K and the like).

The hydrophilic polymer of the present invention is preferably selected from chitosan polymers (which includes derivatized chitosan as described herein), polyethyleneimine resins, polyamine resins (for example polyvinylamine polymers, polyallylamine polymers, polydiallylamine resins and amino(meth)acrylate polymers), polyamide resins, polyamide-epichlorohydrin resins, polyamine-epichlorohydrin resins, polyamidepolyamine-epichlorohydrin resins, as well as dicyandiamide-polycondensation products (for example, polyalkylenepolyamine-dicyandiamide copolymers). These polymers may be employed alone or in a mixture or copolymer of two or more thereof. The polymers preferably have a molecular weight of 5,000 to 500,000, more preferably 5,000 to 200,000. The content of hydrophilic polymer is preferably 5 to 65% by weight, based on the total weight of the imageable layer.

The hydrophilic polymer of the present invention may also comprise saccharides, such as cellulose or starch, or a mixture of such saccharides. The present invention allows for the hydrophilic polymer to be comprised of a mixture of hydrophilic cationic resins and saccharides. Furthermore, the hydrophilic polymer of the present invention may be a derivative of a saccharide and mixtures thereof with any one or more other hydrophilic cationic resin and saccharide.

In one embodiment of the invention, the coatable compositions comprise latices in aqueous carriers, the latices comprising dissolved chitosan and particles comprised of thermally softenable hydrophobic polymer, hydrophilic polymer and the bonding compound, bonding the hydrophobic polymer and the hydrophilic polymer. In this embodiment, therefore, there is dissolved chitosan present, in addition to chitosan that may be the hydrophilic polymer of the hydrophilic polymer particles. The composition may also contain additives to assist in the imaging steps and/or the coating steps. For example, a substance capable of converting the imaging radiation into heat is particularly desirable in the compositions so that the imaging radiation is efficiently absorbed and converted to heat to assist in the softening and coalescing of the polymer particles. The composition preferably contains at least 0.05 to 10% by weight of solids of a substance capable of converting radiation to heat. The substance capable of converting radiation to heat may be a pigment, such as, but not limited to, carbon black, or a dye. Infrared and near infrared (NIR) dyes are particularly suitable for use with infrared (IR) lasers.

In a preferred embodiment of the present invention the substance capable of converting radiation to heat absorbs radiation over the range 700 nm to 1200 nm, more preferably over the range 800 nm to 1100 nm, and most preferably over the range 800 nm to 850 nm, and converts it to heat. Examples of such substances are disclosed in JOEM Handbook 2 Absorption Spectra of Dyes for Diode Lasers, Matsuoka, Ken, bunshin Shuppan, 1990 and Chapter 2, 2.3 of Development and Market Trend of Functional Colouring Materials in 1990's, CMC Editorial Department, CMC, 1990, such as polymethine type coloring material, a phthalocyanine type coloring material, a dithiol metallic complex salt type coloring material, an anthraquinone type coloring material, a triphenylmethane type coloring material, an azo type dispersion dye, and an intermolecular CT coloring material. The representative examples include N-[4-[5-(4-dimethylamino-2-methylphenyl)-2,4-pentadienylidene]-3-methyl-2,5-cyclohexadiene-1-ylidene]-N, N-dimethylammonium acetate, N-[4-[5-(4-dimethylaminophenyl)-3-phenyl-2-pentene-4-in-1-ylidene]-2,5-cyclohexadiene-1-ylidene]-N,N-dimethylammonium perchlorate, bis(dichlorobenzene-1,2-dithiol)nickel(2:1)tetrabutyl-ammonium and polyvinylcarbazol-2,3-dicyano-5-nitro-1,4-naphthoquinone complex. Some specific commercial products that may be employed as substance capable of converting radiation to heat include Pro-jet 830NP, a modified copper phthalocyanine from Avecia of Blackley, Lancashire in the U.K., ADS 830A, an infra-red absorbing dye from American Dye Source Inc. of Montreal, Quebec, Canada, and S0094, S0306, S0391 and S0451, all infrared absorbing dyes from FEW Chemicals GmbH of Wolfen, Germany. Hydrophobic forms of these dyes are particularly preferred as this property makes these dyes more compatible with the hydrophobic aspect of the particles, thereby facilitating heat transfer to the thermally softenable hydrophobic polymer when radiation is being absorbed and heat produced during irradiation of the medium coated on a lithographic base.

Cosolvents (e.g., alcohols, ketones, and other organic solvents), surfactants, blowing agents, and filler (e.g., silica, titania, zinc oxide, zirconia, etc.) are also useful additives, and may be present in non-limiting exemplary amounts of up to 25% by weight of total solids, and the like. The use of filler particles, preferably having volume average particle sizes of between 0.01 to 0.5 micrometers, and less than 50% of the volume average size of the polymeric particles, is particularly desirable. Especially when using inorganic filler particles, such as metal or semimetal oxides or silica, the particles can add a surprisingly higher level of on-press durability to lithographic printing masters prepared from the radiation-sensitive medium of the present invention.

Preferably, the polymer or polymers that constitute the thermally softenable hydrophobic polymer component of the particles have a film forming temperature above ambient temperature (e.g., 20° C.) and may comprise any thermally softenable or heat-fusible polymer, and, by way of non-limiting examples, may be an addition polymer comprising residues derived from one or more of styrene, substituted styrenes, esters of (meth)acrylic acid, vinyl halides, (meth) acrylonitrile, vinyl esters, silicon-containing polymerizable monomers or polyethers. It may also be a polyester, polyamide or polyurethane, or any thermally fusible oleophilic material or composition capable of forming a hydrophobic center/hydrophilic outer layer structure by polymerization with one or more anionic monomers. Preferred materials are addition polymers containing 50% or more by weight of styrene or substituted styrenes. Most preferred materials are polymers containing 50% or more by weight of esters of (meth)acrylic acid. The hydrophobic centers of the polymer particles preferably soften at temperatures such as from 30° C. to 300° C., and more preferably from 50° C. to 200° C. to allow coalescence, flow, phase change or any other phenomenon to occur within or between the particles to effect the hydrophilicity decrease in the surface of the layer. Suitable examples of esters of (meth)acrylic acid include, but are not limited to, methyl (meth)acrylate, ethyl (meth)acrylate, propyl (meth)acrylate, butyl (meth)acrylate and lauryl (meth) acrylate. Suitable examples of substituted styrenes include, but are not limited to, alpha-methylstyrene and vinyltoluene. Suitable examples of substituted vinyl esters include, but are not limited to, vinyl acetate and vinyl propionate. Suitable examples of vinyl halides include, but are not limited to, vinyl chloride and vinylidene chloride.

Co-monomers used with these monomers may include up to 50% by weight of polymerizable monomers having carbon-carbon double bonds including, but not limited to monomers having various types of carboxyl groups, such as acrylic acid, methacrylic acid, crotonic acid, itaconic acid, fumaric acid, maleic acid, citraconic acid and their salts; monomers having various types of hydroxyl groups, such as 2-hydroxyethyl (meth)acrylate, 2-hydroxypropyl (meth)acrylate, 4-hydroxybutyl (meth)acrylate, monobutylhydroxyl fumarate and monobutylhydroxyl itaconate; various types of nitrogen-containing vinyl monomers such as (meth)acrylamides, diacetone acrylamides, N-methylol acrylamides; sulphonamide- or phosphorus-containing vinyl monomers; various types of conjugated dienes such as butadiene; dicarboxylic acid half-esters of hydroxyl group-containing polymers, such as phthalic, succinic or maleic acid half esters of a polyvinyl acetal and, in particular, of a polyvinyl butyral; and alkyl or aralkyl half esters of styrene- or alkyl vinyl ether-maleic anhydride copolymers, in particular alkyl half esters of styrene-maleic anhydride copolymers.

In a preferred embodiment of the invention, the hydrophilic polymer is chitosan, which is normally prepared from chitin. Chitosan, an aminopolysaccharide, is bio-friendly. Despite its abundance in nature, chitin has not been effectively utilized because of its low solubility in aqueous solutions. Owing to this problem, chitin is difficult to form into fibers or films and thus, has found limited applications. In an effort to overcome this problem, chitin is often converted into chitosan. A deacetylation technique is generally used for the conversion of chitin into chitosan. U.S. Pat. No. 3,533,940 discloses a method for preparing chitosan from chitin, along with its application to fibers and films; For possible applications, the prepared chitosan is dissolved in aqueous organic solutions.

Chitosan may be provided in the practice of the present invention in a wide range of properties as long as its hydrophilic surface properties are maintained. A non-limiting example of the types of chitosan that are particularly useful in the practice of the invention are-chitosan which ranges in molecular weight from 5,000 to 500,000, more preferably 5,000 to 200,000, and in deacetylation degree from 60 to 99%, more preferably from 70 to 95%. The chitosan also provides an emulsifying agent for the thermally softenable or fusible polymer particles when in the coating composition.

Synthesis of the Radiation-Sensitive Medium

A preferred mode of synthesis of the radiation-sensitive medium of the present invention is performed via the following steps, illustrated by, but not limited to, the use of chitosan as hydrophilic polymer. The hydrophilic polymer is dissolved in a suitable solvent and the hydrophobic monomer is added. An initiator may be added in either of these steps. The resultant mixture is polymerized by heating. The bonding compound may be added either during or after the polymerization of the hydrophobic monomer. The substance capable of converting radiation to heat is added prior to coating. Minor amounts of co-solvents, blowing agents, fillers and surfactants may be added at various stages of the synthesis.

Any solvent may be used that dissolves the chitosan and not the hydrophobic monomer, selected from aqueous acidic solutions, aqueous inorganic salt solutions and organic solvents. To obtain an aqueous acidic solution, which is a desired route in practicing the invention, water is added with 0.1-20 wt % of an acid, which is selected from the group consisting of organic acids, such as acetic acid and lactic acid, and inorganic acids, such as hydrochloric acid. Available inorganic salt solutions that can assist in the dissolving of chitosan include, by way of non-limiting examples, an inorganic salt at an amount of 10-70 wt % in water. The inorganic salt is particularly desirably selected from the group consisting of alkali metal (e.g., sodium) thiocyanate, metal chlorides (e.g., zinc chloride, calcium chloride, sodium chloride, potassium chloride, lithium chloride, and mixtures thereof. Organic solvents that may be useful in carrying the dissolved chitosan in the present invention are polar, examples of which include dimethylacetamide, N-methylpyrrolidone, dimethylformamide, diethylacetamide, trifluoroacetic acid, trichloroacetic acid, and mixtures thereof. In order to obtain higher polarity, one or more selected from the above-mentioned inorganic metal salts may be added at an amount of 0.1-10 wt % to the organic solvent.

The polymerization process can be effected as described by Wen-Yen Chiu et al. in Journal of Polymer Science A (Polymer Chemistry) volume 39, 2001, pp 1646-1655. The co-monomer, e.g. (meth)acrylic acid, can be copolymerized with the primary component of the hydrophobic polymer composition, e.g. styrene or methyl methacrylate. In the polymerization process, an initiator (e.g., persulfate-metabisulfite) must be present. Other commonly known initiators for radical polymerization can also be used to give satisfactory polymers as described by Odian in Principles of Polymerization, 3$^{rd}$ Edition, publisher John Wiley & Sons, NY (1991) pp 212-215, 219-225 and 229-232.

The post-polymerization mix may generally comprise the following:

solvent (40-97 w/w % of total mix)

excess dissolved hydrophilic solubilizable polymer (0.01-50 w/w % of total mix)

particles comprising electrically neutral hydrophobic polymer (2-59 w/w % of total mix)

The post-polymerization mix comprises a continuous phase and a dispersed phase, the dispersed phase comprising 50-99.9 w/w % of polymerized electrically neutral hydrophobic monomer and 0.1-50 w/w % polymerized anionic monomer. The post-polymerization mix may contain suspended solids in the size range from 0.01 to 5 microns.

Minor amounts of additives may be added at various stages of the polymerization or particle formation process. Surfactants can be added (e.g., silicone-polyether,) to improve film forming quality when the composition is coated onto a surface. A plasticizer may be added at any time before coating of the composition, but is preferably present well before the coating to allow it to mix with the polymer.

In a further step 0.05 to 10 w/w % of solids of the substance capable of converting radiation into heat is added. Other additives, including the co-solvents, surfactants, blowing agents and fillers, can be added in amounts from 0-25 w/w % of solids.

Aqueous Eluable Hydrophilic Overcoat

The lithographic printing plate precursor of the present invention preferably comprises an aqueous eluable hydrophilic overcoat provided on the heat-sensitive hydrophilic layer to improve the overall performance of the lithographic printing plate. The inventors have found that an aqueous-soluble or aqueous-dispersible hydrophilic overcoat on top of the heat-sensitive hydrophilic layer will prevent the surface of the heat-sensitive layer from being contaminated and/or scratched during storage and/or handling. The aqueous-soluble or aqueous-dispersible hydrophilic overcoat provided on the heat-sensitive hydrophilic layer of the lithographic printing plate precursor also significantly improves start-up on press. A further benefit stems from the fact that the overcoat provides a higher optical reflectivity value, which is particularly useful in platesetter systems that employ an autofocus arrangement to focus the imaging radiation on the imageable layer. Since many lithographic printing plate precursors tend to exhibit changes in characteristics with time, temperature and humidity, the overcoat also helps in minimizing these effects.

As the lithographic printing plate precursor of the invention does not require a wet processing step after exposure, the hydrophilic overcoat eluable in aqueous media has been designed to be easily removable, at least in the imaged areas, during start-up on press. Some of the specific requirements taken into consideration during the design, were the eluability in water or fountain, a high thermal stability to ensure minimal thermal degradation during imaging, minimal compatibility with the heat-sensitive hydrophilic layer to allow rapid removal, chemical inertness to satisfy product shelf life requirements. The overcoat thus comprises a resin, or a mixture of resins, selected from the group of water-soluble organic polymers.

Representative examples of these resins include polyvinylalcohol, polyvinylacetate, polyacrylic acid, poly(meth) acrylic acid or its alkali metal salt and amine salt, poly 2-hydroxyethyl(meth)acrylate, poly(meth)acrylamide, polyvinyl methyl ether, polyvinyl methyl ether/maleic anhydride copolymer, polyvinylpyrollidone, poly-2-acrylamide-2-methylpropane sulfonic acid and alkali metal or amine salt thereof, alginic acid or its salts, protan jelly, carageenin, tragacanth, laminarin sulfate, starch, animal glues, vegetable mucilages, gum arabic, cellulose and modification product thereof, polysaccharides such as dextran, pullulan, or chitosan. The term saccharide is used herein as defined by IUPAC, being inclusive of monosaccharides and di-, oligo- and polysaccharides, the di-, oligo- and polysaccharides being made up of a plurality of monosaccharide units linked to each other by a glycosidic bond.

The aqueous eluable hydrophilic overcoat may comprise additional ingredients, such as a second polymer, a plasticizer to give the coating flexibility and reduce cracking, a light-to-heat-converting agent to counteract any speed loss due to the additional coating thickness, a surfactant or wetting agent to improve coatability, a water-soluble visible dye or colorant to help with the QC of the hydrophilic overcoat, and a highly water-soluble crystalline compound to accelerate the breakdown of the structural integrity of the overcoat during roll-up on press. The aqueous eluable hydrophilic overcoat may also comprise ingredients, such as small carboxylic acid molecules (e.g citric acid), polyvinylphosphonates, and other materials commonly found in plate storage gum solutions, e.g. phosphates, sodium hexametaphosphate, sodium gluconate, tartaric acid. Representative examples of suitable plasticizers are ethylene glycol, glycerin, sorbitol, carboxymethylcellulose.

Preferably, the light-to-heat converting agent is a water-soluble IR dye, for example, a water-soluble cyanine dye as described in U.S. Pat. Nos. 6,159,657, 6,397,749, 6,410,202, or as commercially available from FEW Chemicals, but other IR-absorbing dyes may be used as well. Acid Green 25 is one example for a useful water-soluble visible dye. Useful examples of highly water-soluble crystalline compounds have been described in U.S. Pat. No. 5,677,110. An especially preferred highly water-soluble crystalline compound is glucose.

The coating weight of the aqueous eluable hydrophilic overcoat preferably is 0.5 $g/m^2$ or less. More preferably the coating weight is 0.1 $g/m^2$ or less. Most preferably the coating weight of the overcoat is between 0.01 and 0.05 $g/m^2$. This coating weight of the protective layer is low enough not to negatively affect the oleophilicity of the imaged areas or to result in a significant increase of the exposure energy required for optimum image formation.

Water-soluble overcoats applied to radiation-sensitive layers are well-known in the industry, but need to be designed for the particular application or medium to be coated. It is not obvious that overcoats previously disclosed will function appropriately for the present aqueous-ineluable coating of radiation-sensitive medium. One example is that of United States Patent U.S. Pat. No. 6,513,433 (Inoue et al.) Inoue et al. describes a water soluble overcoat layer provided on the heat sensitive layer of that patent. However, the particular heat sensitive layer of U.S. Pat. No. 6,513,433 is of a different composition, functions by a totally different mechanism from that employed in the present invention, and, additionally, is removed by the on-press fountain solution in the unexposed areas. In contrast, the aqueous-ineluable coating of radiation-sensitive medium of the present invention is not removed in the unexposed areas.

Preparation of the Precoated Processless Radiation-Imageable Lithographic Printing Precursor The radiation-sensitive medium is applied to a substrate and dried by the standard coating and drying methods employed in the manufacture of printing plate precursors and other metal, plastic, ceramic and paper products, to create a radiation-imageable layer. Similarly, after the layer of radiation-sensitive medium has been applied and dried, the aqueous eluable hydrophilic overcoat may be applied and dried using standard coating and drying methods. The two coatings, however, do not have to use the same coating or drying techniques. The drying temperature for the protective aqueous eluable hydrophilic overcoat preferably is low enough not to cause any negative effects on the coated and dried radiation-imageable layer. For example if the drying temperature of the aqueous eluable hydrophilic overcoat is too high (more than 100° C.) a bleaching of the coated and dried radiation-imageable layer may be observed. The substrate material used depends upon the purpose for which the image is to be used and may be, for example, formed of metal, polymer material (such as, but not limited to, PET), paper, ceramic, or composite material. The substrate is preferably aluminum and more preferably chemically treated aluminum, grained aluminum, anodized aluminum, aluminum coated substrates, or combinations thereof. Preferably, the substrate is sufficiently flexible to facilitate mounting on presses. To the extent that the precoated processless radiation-imageable lithographic printing precursor of the present invention does not require any water carrying or water abhesive quality from the substrate, the substrate being not exposed during printing, there is wide scope of choice for the materials of which the substrate may be composed.

According to another embodiment in connection with the present invention, the substrate comprises a flexible support, such as e.g. paper or plastic film, provided with a further adhesion-promoting layer of cross-linked polymer. A suitable cross-linked hydrophilic layer may be obtained from a hydrophilic (co-) polymer cured with a cross-linking agent such as a hydrolysed tetra-alkylorthosilicate, formaldehyde, glyoxal or polyisocyanate. Particularly preferred is the hydrolysed tetra-alkylorthosilicate. For the purposes of the present invention, this layer must be capable of being wetted by the radiation-sensitive medium to give a good quality of coating and is therefore usually hydrophilic. The hydrophilic (co-) polymers that may be used comprise for example, homopolymers and copolymers of vinyl alcohol, hydroxyethyl acrylate, hydroxyethyl methacrylate, acrylic acid, methacrylic acid, acrylamide, methylol acrylamide or methylol methacrylamide. The hydrophilicity of the (co-) polymer or (co-) polymer mixture used is preferably higher than that of polyvinyl acetate hydrolyzed to at least an extent of 60 percent by weight, preferably 80 percent by weight.

In a further embodiment of the invention, an adhesion-promoting layer is coated on the substrate. Suitable adhesion-promoting layers for use in accordance with the present invention comprise a hydrophilic (co-) polymer binder and colloidal silica as disclosed in EP 619524, and EP 619525. Preferably, the amount of silica in the adhesion-promoting layer is between 0.2 and 0.7 mg per $m^2$. Further, the ratio of silica to hydrophilic (co-) polymer binder is preferably more than 1 and the surface area of the colloidal silica is preferably at least 300 $m^2$ per gram.

Preparation of the Negative-Working Lithographic Printing Master

The preparation of the negative-working lithographic printing master may be performed on a platesetter machine or directly on the printing press. In both cases, the precoated processless radiation-imageable lithographic printing precursor of the invention may be mounted on the platesetter or printing press. Alternatively, in the case of either machine, the radiation-sensitive medium and the aqueous eluable hydrophilic overcoat may be applied to the substrate and to the coated and dried first layer of radiation sensitive medium while the substrate resides on the relevant machine. The substrate may be an integral part of the press or it may be removably mounted on the press. In this embodiment, the imageable coating may be dried by means of a curing unit integral with the press, as described in U.S. Pat. No. 5,713,287 (Gelbart). It is also possible to coat a cylinder of a printing press with a layer of radiation-sensitive medium when the cylinder is separate from the press. Before applying the imageable coating to the substrate, the substrate may be treated to enhance the adhesion of the imageable coating.

In a preferred embodiment of the invention, the radiation-sensitive medium of the coating is imagewise converted by means of the spatially corresponding imagewise generation of heat within the coating to form a hydrophobic area corresponding to areas imagewise irradiated. The imaging process itself may be by means of scanned laser radiation as described in U.S. Pat. No. 5,713,287. The wavelength of the laser light and the absorption range of the converter substance are chosen to match each other. The heat to drive the process of converting the irradiated areas of the precursor from hydrophilic to hydrophobic is produced via the substance capable of converting radiation into heat. The radiation-sensitive medium of the present invention, when coated and dried on a suitable substrate, therefore becomes hydrophobic under the action of heat. The aqueous eluable hydrophilic overcoat of the precursor remains largely unaffected in this imaging process. During subsequent wet lithographic offset printing, the on-press fountain solution, being an aqueous medium, removes the aqueous eluable hydrophilic overcoat, at least in the imaged areas, to expose the underlying layer of imagewise irradiated imageable coating for use in printing. Any small amounts of aqueous eluable hydrophilic overcoat remaining in the unimaged areas after such treatment with fountain solution do not constitute a problem in printing, since the aqueous-ineluable coating of a radiation-sensitive medium in that area remains hydrophilic anyway.

The exposed areas of the imageable coating will be hydrophobic and the lithographic printing ink will adhere preferentially to these areas, as water or fountain solution will be adhering to the hydrophilic areas. This makes the processless printing master of the present invention inherently negative-working. The method does not require a substrate of controlled hydrophilicity and provides great toughness in the exposed areas of the precursor, thereby extending the run length of the negative-working lithographic printing master. The aqueous eluable hydrophilic overcoat assures a trouble-free startup on press, even for plates that have aged.

Without limiting the scope of the invention in any way, the mechanism by which the irradiated areas of the layer become hydrophobic is believed to be as follows. When the radiation-imageable layer is imaged, the substance capable of converting radiation into heat provides imagewise distributed heat. This imagewise distributed heat provides the activation energy required to turn the imageable layer from, what the inventors believe to be, a metastable state into a thermodynamically stable state. The majority of the copolymer is the thermally softenable hydrophobic polymer. However, when the imageable layer is coated and dried, the particles are locked into a metastable state in which the more hydrophilic surface regions of the polymer particles dominate the surface energy, rendering the layer hydrophilic. It is believed that this happens because the coating occurs out of a highly polar solvent mix, which favors the hydrophilic state. After drying, the solvents are removed, but the solids remain in the metastable hydrophilic state. Upon exposure to radiation that gets converted to heat by the substance capable of converting radiation into heat, the required activating energy is provided for the polymer particles in the exposed areas to relax to the thermodynamically stable hydrophobic state and at least partially coalesce. In the unirradiated areas, where the activating energy has not been provided, the coated layer remains hydrophilic. During wet offset printing, the irradiated regions form the ink-accepting image-areas, whereas the unirradiated areas of the layer remain hydrophilic and take fountain solution, thereby being abhesive to ink.

The imaging process is irreversible when performed. The areas of the composition exposed to imaging radiation remain hydrophobic and cannot be reversed to form a useable processless radiation-imageable lithographic printing precursor by way of thermal treatment (heating or cooling), radiation treatment to the same or different imaging range of radiation. The composition and radiation-sensitive medium is aqueous-ineluable when coated and dried and is specifically not removable by water or fountain-solution when coated and dried.

As is evident, the radiation-sensitive medium and lithographic printing precursors of the present invention allow the combination of the benefits of the newer generation of polymer particle/coalescence-type of thermally sensitive media with the substrate-independence of a switchable polymer approach to plate-making. With the particles having a substantially hydrophilic nature, rather than merely superficial, there is also reduced scumming, a phenomenon that occurs when the water-bearing area of the master loses some of its hydrophilic nature and starts to take ink. This provides a master with excellent run-length, which is nevertheless producible from an aqueous based radiation-sensitive medium.

EXAMPLES

All materials used in the following examples are readily available from standard commercial sources, such as Aldrich Chemical Co. (Milwaukee, Wis.), Polysciences, Inc. (Warrington, Pa.) or VWR Canlab, (Mississauga, Canada), unless otherwise specified.

Chitosan was obtained as "High Viscosity Chitosan" from Vanson, Redmond, Wash., USA or as "Chitosan" from Primex, Siglufijordur, Iceland.

The infrared dyes are S0094 and S0391 from FEW Chemicals GmbH in Wolfen, Germany.

The wetting agent is BYK-345 from BYK-Chemie, Wallingford, Conn., USA.

Triton X-405 was obtained from Dow Chemical Company, Midland, Mich., USA.

Gum Arabic was obtained as "100% Pure Gum Arabic" from Anchor, Orange Park, Fla., USA.

All infrared laser exposure was at 830 nm wavelength using a Creo Trendsetter (TM) platesetting machine.

Example 1

A plate was produced by coating the following formulation on to a grained, anodized aluminum plate to give a dry coating weight of 1 g/m$^2$: 30 g Chitosan/PS copolymer (13 wt % Chitosan and 87% Styrene) aqueous dispersion with 10% solids in aqueous and 9 g of 2 wt % infrared dye in ethanol. After drying at room temperature for 5 minutes, the plate was imaged using infrared laser exposure of 500 mJ/cm$^2$ at 15 Watts. The imaged plate was mounted onto a press (Ryobi), dampened with fountain solution for 30 seconds before the ink was applied to the plate. 1000 impressions were printed on coated paper with little deterioration of printing quality. During printing, the surface on background remains unchanged.

Example 2

A plate was produced by coating the following formulation on to ungrained, unanodized aluminum plate to give a dry coating weight of 1 g/m$^2$: 30 g Chitosan/PS copolymer (13 wt % Chitosan and 87% Styrene) aqueous dispersion with 10% solid and 9 g of 2 wt % infrared dye in ethanol. After drying at room temperature for 5 minutes, the plate was imaged using infrared laser exposure of 500 mJ/cm$^2$ at 15 Watts. The imaged plate was mounted onto a press (Ryobi), dampened with fountain solution for 30 seconds before the ink was applied to the plate. 1000 impressions were printed on coated paper with little deterioration of printing quality. During printing, the surface on background remains unchanged.

Example 3

A plate was produced by coating the following formulation on to a Ceramic Paper to give a dry coating weight of 1 g/m$^2$: 30 g Chitosan/PS copolymer (13 wt % Chitosan and 87% Styrene) aqueous dispersion with 10% solid and 9 g of 2 wt % infrared dye in ethanol. After drying at room temperature for 5 minutes, the plate was imaged using infrared laser exposure of 500 mJ/cm$^2$ at 15 Watts. The imaged sample was mounted onto a press (Ryobi), dampened with fountain solution for 30 seconds before the ink was applied to the plate. 3000 impressions were printed on coated paper with little deterioration of printing quality. During printing, the surface on background remains unchanged.

Example 4

A plate was produced by coating the following formulation on to a grained, anodized aluminum plate to give a dry coating weight of 1 g/m$^2$: 30 g Chitosan/PS/AN copolymer (13 wt % Chitosan, 78% Styrene, 9% Acrylonitrile) aqueous dispersion with 10% solid and 9 g of 2 wt % infrared dye in ethanol. After drying at 60° C. for 2 minute, the plate was imaged using infrared laser exposure of 500 mJ/cm$^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 5

A plate was produced by coating the following formulation on to a grained, anodized aluminum plate to give a dry coating weight of 1 g/m$^2$: 30 g Chitosan/PS/AA copolymer (13 wt % Chitosan, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 6

A plate was produced by coating the following formulation on to a grained, anodized aluminum plate to give a dry coating weight of 1 g/m$^2$: 15 g Gelatin/PS/AN copolymer (13 wt % Gelatin, 78% Styrene, 9% Acrylonitrile) aqueous dispersion with 10% solid and 15 g Chitosan/PMMA/A copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15

Watts. The imaged plate was mounted onto a press (Multi), dampened with fountain solution for 30 seconds before the ink was applied to the plate. 5000 impressions were printed on uncoated paper. During printing, the surface on background remains unchanged.

Example 7

A plate was produced by coating the following formulation onto a grained, anodized aluminum plate to give a dry coating weight of 1 g/m$^2$: 15 g Starch/PS/AN copolymer (13 wt % Starch, 78% Styrene, 9% Acrylonitrile) aqueous dispersion with 10% solid and 15 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 8

A plate was produced by coating the following formulation onto a grained, anodized aluminum plate to give a dry coating weight of 1 g/m$^2$: 24 g Chitosan/PS copolymer (13 wt % Chitosan and 87% Styrene) aqueous dispersion with 10% solid and 6 g Chitosan/PMMA/A copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 9

A plate was produced by coating the following formulation onto a grained, anodized aluminum plate to give a dry coating weight of 1 g/m$^2$: 24 g Chitosan/PS/AN copolymer (13 wt % Chitosan, 78% Styrene, 9% Acrylonitrile) aqueous dispersion dispersion with 10% solid and 6 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 10

A plate was produced by coating the following formulation onto a grained, anodized aluminum plate to give a dry coating weight of 1 g/m$^2$: 30 g Chitosan/PS/AA copolymer (13 wt % Chitosan, 78% Styrene, 9% Acrylic acid) aqueous dispersion with 10% solid and 9 g of 5 wt % carbon black (CAB-O-JET 200) in water. After drying at 60° C. for 2 minutes, the plate was imaged using infrared laser exposure of 800 mJ/cm$^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 11

A plate was produced by coating the following formulation onto a grained, anodized aluminum plate to give a dry coating weight of 1 g/m$^2$: 30 9 Starch/PS/AA copolymer (13 wt % starch, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 12

A plate was produced by coating the following formulation onto a grained, anodized aluminum plate to give a dry coating weight of 1 g/m$^2$: 30 g Gelatin/PS/M copolymer (13 wt % Gelatin, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 13

A plate was produced by coating the following formulation onto a grained, anodized aluminum plate to give a dry coating weight of 1 g/m$^2$: 30 g Cellulose/PS/M copolymer (13 wt % Cellulose, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Wafts. The imaged plate was mounted onto a press (Multi), dampened with fountain solution for 30 seconds before the ink was applied to the plate. 500 impressions were printed on uncoated paper. During printing, the surface on background remains unchanged.

Example 14

A plate was produced by coating the following formulation onto a grained, anodized aluminum plate to give a dry coating weight of 1 g/m$^2$: 30 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/cm$^2$ at 15 Wafts. The imaged plate was mounted onto a press (Multi), dampened with fountain solution for 30 seconds before the ink was applied to the plate. 1000 impressions were printed on uncoated paper. During printing, the surface on background remains unchanged.

Example 15

A plate was produced by coating the following formulation onto a grained, anodized aluminum plate to give a dry coating weight of 1 $g/m^2$: 30 g Chitosan/PS/PMMA/A copolymer (13 wt % Chitosan, 39% Styrene, 36% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Wafts. The imaged sample was mounted onto a press (Multi), dampened with fountain solution for 30 seconds before the ink was applied to the plate. 500 impressions were printed on uncoated paper. During printing, the surface on background remains unchanged.

Example 16

A plate was produced by coating the following formulation on to a grained, anodized aluminum plate to give a dry coating weight of 1 $g/m^2$: 25 g Chitosan/PS/AA copolymer (13 wt % Chitosan, 78% Styrene, 9% Acrylic acid) aqueous dispersion with 10% solid, 5 g of 10% Zinc oxide in ethanol and and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 17

A plate was produced by coating the following formulation on to a grained, anodized aluminum plate to give a dry coating weight of 1 $g/m^2$: 25 g Chitosan/PS/AA copolymer (13 wt % Chitosan, 78% Styrene, 9% Acrylic acid) aqueous dispersion with 10% solid 5 g of 10% $SiO_2$ in ethanol and and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 18

A plate was produced by coating the following formulation on to a grained, anodized aluminum plate to give a dry coating weight of 1 $g/m^2$: 30 g Chitosan/PnBMA/AA copolymer (13 wt % Chitosan, 78% n-butyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 19

A plate was produced by coating the following formulation on to a grained, anodized aluminum plate to give a dry coating weight of 1 $g/m^2$: 30 g Chitosan/PtBMA/AA copolymer (13 wt % Chitosan, 78% t-Butyl methacrylate, 9% Acrylic acid) aqueous dispersion with 10% solid—and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 20

A plate was produced by coating the following formulation on to a grained, anodized aluminum plate to give a dry coating weight of 1 $g/m^2$: 30 g Chitosan/PEMA/A copolymer (13 wt % Chitosan, 78% Ethyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 21

A plate was produced by coating the following formulation on to a grained, anodized aluminum plate to give a dry coating weight of 1 $g/m^2$: 30 g Chitosan/PtBS/AA copolymer (13 wt % Chitosan, 78% 4-t-Butyl styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 10,000 impressions were printed on uncoated paper. During printing, the surface on background remains unchanged.

Example 22

A plate was produced by coating the following formulation on to a grained, anodized aluminum plate to give a dry coating weight of 1 $g/m^2$: 30 g Chitosan/PCIS/AA copolymer (13 wt % Chitosan, 78% 4-Chloro styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 4000 impressions were printed on uncoated paper. During printing, the surface on background remains unchanged.

Example 23

A plate was produced by coating the following formulation on to a grained, anodized aluminum plate to give a dry coating weight of 1 $g/m^2$: 30 g Chitosan/Pα MS/AA copolymer (13 wt % Chitosan, 78% α-methyl styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 4000 impressions were printed on uncoated paper. During printing, the surface on background remains unchanged.

Example 24

A plate was produced by coating the following formulation on to a grained, anodized aluminum plate to give a dry coating weight of 1 $g/m^2$: 30 g Chitosan/PMS/AA copolymer (13 wt % Chitosan, 78% 4-methyl styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 25

To a 10 L glass reactor equipped with thermometer, mechanical stirring, nitrogen inlet and heating bath, set to 60° C., containing a stirring solution under nitrogen of 120 g chitosan, 8.52 g of potassium persulfate and 8.53 g of sodium metabisulfite in 159 g of acetic acid and 7910 g of water, was added 712 g of styrene and 80 g of acrylic acid. After 6 hours, stirring was stopped and the reactor contents were filtered to give an opaque white liquid, 3 g of which was mixed with 1 g of 1% infrared dye in ethanol and 1 g of 0.2% wetting agent in water. When coated onto an aluminum substrate, dried, imaged with 830 nm laser radiation with an exposure of 300 $mJ/cm^2$ the resulting plate printed to over 5,000 pages without loss of coating in either exposed or unexposed areas.

Example 26

To a 10 L glass reactor equipped with thermometer, mechanical stirring, nitrogen inlet and heating bath, set to 60° C., containing a stirring solution under nitrogen of 120 g chitosan, 8.52 g of potassium persulfate and 8.53 g of sodium metabisulfite in 159 g of acetic acid and 7910 g of water, was added 633 g of styrene, then 158 g of acrylic acid. After 6 hours, stirring was stopped and the reactor contents were filtered to give an opaque white liquid, 3 g of which was mixed with 1 g of 1% infrared dye in ethanol and 1 g of 0.2% wetting agent in water. When coated onto an aluminum substrate, dried, imaged with 830 nm laser radiation with an exposure of 300 $mJ/cm^2$, the resulting plate printed to over 5,000 pages without loss of coating in either exposed or unexposed areas.

Example 27

In a 2 L glass vessel equipped with mechanical stirring and nitrogen atmosphere was prepared a mixture of 791.99 g deionized water, 19.27 g acetic acid, 12.10 g chitosan and 0.0723 g iron gluconate having a viscosity of 32.6 cps at 25° C.; to this was added 57.47 g methyl methacrylate, 6.39 g acrylic acid, 0.229 g Triton X-405 and 80.24 g more deionized water, then, after stirring at 1200 rpm and 60° C. for 15 minutes, a solution of 0.980 g of ammonium sulfite and 1.080 g of 50% aqueous glyoxylic acid in 12.36 g of deionized water with rinsing by 1.0 g of deionized water, then after 10 minutes still stirring at 1200 rpm, 1.188 g of 55% pinane hydroperoxide in pinane, then after a further 10 minutes at 800 rpm, a further 0.584 g of 55% pinane hydroperoxide in pinane, then after a further 5 minutes at 800 rpm then 10 minutes at 400 rpm, a further solution of 0.979 g of ammonium sulfite and 1.079 g of 50% aqueous glyoxylic acid in 12.34 g of deionized water with rinsing by 1.0 g of deionized water. During this time the pot temperature had risen by 7° C.; after a further 90 minutes at 400 rpm, the hot opaque white liquid was passed through successive filters having nominal ratings of 100, 10 then 1 microns. The resulting filtrate was a latex containing particles having d(50) diameter of 0.138 microns by light-scattering, for 7.94% nonvolatile solids (expected 8.00% from the monomers).

38.7 g of a latex made according to the above recipe was mixed with 7.9 g of 2% acetic acid and 3.4 g of 1-methoxy-2-propanol containing 2.8% IR dye and 0.84% of a wetting agent and 0.025% glyoxal when coated on a grained and anodized aluminum substrate, dried to give a dry coatweight of ca. 1.8 gsm, imaged using infrared exposure of 275 mJ/cm2 at 15 Watts. The imaged plate was mounted onto a press, dampened with fountain solution for 30 seconds before the ink was applied to the plate. Over 25,000 impressions without loss of coating in either exposed or unexposed areas were printed. During printing, the surface on the background remains unchanged.

Example 28

In a 10 L glass vessel equipped with mechanical stirring and nitrogen atmosphere was prepared a mixture of 7158.41 g deionized water, 172.95 g acetic acid, 108.76 g chitosan and 1.160 g iron gluconate having a viscosity of 18.5 cps at 25° C.; to this was added 516.88 g methyl methacrylate, 57.43 g acrylic acid, 2.03 g Triton X-405 and 698.28 g more deionized water, then, after stirring at 340 rpm and 60° C. for 10 minutes, a solution of 8.81 g of ammonium sulfite and 9.72 g of 50% aqueous glyoxylic acid in 111.08 g of deionized water with rinsing by 5.0 g of deionized water, then after 10 minutes still stirring at 340 rpm, 10.546 g of 55% pinane hydroperoxide in pinane, then after a further 10 minutes at 340 rpm, a further 5.293 g of 55% pinane hydroperoxide in pinane, then after a further 15 minutes at 340 rpm, a further solution of 8.80 g of ammonium sulfite and 9.71 g of 50% aqueous glyoxylic acid in 110.95 g of deionized water with rinsing by 5.0 9 of deionized water. During this time the pot temperature had risen by 9° C.; after a further 5 minutes at 340 rpm, then 85 minutes at 180 rpm, the hot opaque white liquid was passed through successive filters having nominal ratings of 100, 10 then 1 microns. The resulting filtrate was a latex containing particles having d(50) diameter of 0.133 microns by light-scattering, for 7.88% nonvolatile solids (expected 8.02% from the monomers).

34.8 g of a latex of this recipe was mixed with 11.8 g of 2% acetic acid and 3. 4 g of 1-methoxy-2-propanol containing 2.8% IR dye and 0.84% of a wetting agent and 0.025% glyoxal when coated on a grained and anodized aluminum substrate, dried to give a dry coatweight of ca. 1.8 gsm, imaged using infrared exposure of 275 mJ/cm2 at 15 Watts. The imaged plate was mounted onto a press, dampened with fountain solution for 30 seconds before the ink was applied to the plate. Over 25,000 impressions without loss of coating in either exposed or unexposed areas were printed. During printing, the surface on the background remains unchanged.

Example 29

34.8 g of the latex of example 28 was mixed with 11.8 g of 2% acetic acid and 3. 4 g of 1-methoxy-2-propanol containing 2.8% IR dye and 0.84% of a wetting agent and 0.025% glyoxal when coated on a grained and anodized aluminum substrate, dried to give a dry coatweight of ca. 1.8 gsm, a second layer was then applied by spraying from a solution comprising 0.2g of 25% gum arabic solution and 0.005 g wetting agent and 9.8 g DI water, dried to give a dry coatweight of ca. 0.03 gsm, imaged using infrared exposure of 275 mJ/cm2 at 15 Watts.

The imaged plate was mounted onto a press, dampened with fountain solution for 30 seconds before the ink was applied to the plate. Over 25,000 impressions without loss of coating in either exposed or unexposed areas were printed. During printing, the surface on the background remains unchanged. The benefit of a topcoat was observed when the plate with and without a topcoat was press tested after 6 weeks storage under ambient conditions. The press results are summarized in Table 1 below.

TABLE 1

| | Number of printed sheets required to give a tone free background in the printed sheet | |
|---|---|---|
| | After 1 week | After 6 weeks |
| example 28 | ≦10 | 700 |
| example 29 | ≦10 | ≦10 |

Example 30

34.8 g of the latex of example 28 was mixed with 11.8 g of 2% acetic acid and 3.4 g of 1-methoxy-2-propanol containing 2.8% IR dye and 0.84% of a wetting agent and 0.025% glyoxal when coated on a grained and anodized aluminum substrate, dried to give a dry coatweight of ca. 1.8 gsm, a second layer was then applied by coating a solution comprising 2.5% (by weight) gum arabic solution in DI water, which was then dried to give a dry coatweight of ca. 0.01 gsm. A higher topcoat coatweight was achieved by coating a 5% (by weight) gum arabic solution, which gave ca. 0.1 gsm.

Plates based on example 28 and the present example 30 were then stored at 30C and 85% relative humidity for 5 days. The purpose of this test is to accelerate the aging of the plate seen at lower temperature and humidity conditions. These plates were then imaged using infrared exposure of 325 mJ/cm2 at 17.4 Watts. The imaged plate was mounted onto a press, dampened with fountain solution for 30 seconds before the ink was applied to the plate. The number of printed sheets required to give a clean background on the printed sheet was noted as well as the tendency towards plugging of the shadows and the print quality of the plate are summarized in the Table 2.

TABLE 2

| Example number | Topcoat coatweight (gsm) | Aged at 30 C. @85% RH 5 days | Number of copies to obtain a clean background on the printed sheet | Plugging of the shadows | Presence of 2% dots at 240 lpi imaged at 325 mJ/cm2 |
|---|---|---|---|---|---|
| 28 | None | No | ≦10 | No | Complete |
| 28 | None | Yes | >3,000 | Yes | Complete |
| 30 | ca. 0.05 | Yes | <10 | No | Complete |
| 30 | ca. 0.1 | Yes | <10 | No | Incomplete |

Example 31

34.8 g of the latex of example 28 was mixed with 11.8 g of 2% acetic acid and 3.4 g of 1-methoxy-2-propanol containing 2.8% IR dye and 0.84% of a wetting agent and 0.025% glyoxal when coated on a grained and anodized aluminum substrate, dried to give a dry coatweight of ca. 1.8 gsm, a second layer was then applied by coating from a solution comprising 0.11 g of polyvinyl alcohol, 0.02 g of chitosan, 0.01 g of glucose, 0.22 acetic acid and 9.64 g DI water, dried to give a dry -coatweight of ca. 0.01 gsm. A higher topcoat coatweight was achieved by coating a solution comprising 0.22 g of polyvinyl alcohol, 0.04 g of chitosan, 0.02 g of glucose, 0.44 g acetic acid and 9.28 g DI water, which gave a topcoat coat weight of ca. 0.1 gsm.

Plates based on example 28 and present example 31 were then stored at 30C and 85% relative humidity for 5 days. These plates were then imaged using infrared exposure of 325 mJ/cm2 at 17.4 Watts. The imaged plate was mounted onto a press, dampened with fountain solution for 30 seconds before the ink was applied to the plate. The number of printed sheets required to give a clean background on the printed sheet was noted as well as the tendency towards plugging of the shadows and the print quality of the plate are summarized in the Table 3.

TABLE 3

| Example number | Topcoat coatweight (gsm) | Aged at 30 C. @85% RH 5 days | Number of copies to obtain a clean background on the printed sheet | Plugging of the shadows | Presence of 2% dots at 240 lpi imaged at 325 mJ/cm2 |
|---|---|---|---|---|---|
| 28 | None | No | ≦10 | No | Complete |
| 28 | None | Yes | 400 | Yes | Complete |
| 31 | ca. 0.01 | Yes | <10 | No | Complete |
| 31 | ca. 0.1 | Yes | <10 | No | Incomplete |

Example 32

34.8 g of the latex of example 28 was mixed with 11.8 g of 2% acetic acid and 3.4 g of 1-methoxy-2-propanol containing 2.8% IR dye and 0.84% of a wetting agent and 0.025% glyoxal when coated on a grained and anodized aluminum substrate, dried to give a dry coatweight of ca. 1.8 gsm, a second layer was then applied by coating from a solution comprising 0.13 g of polyvinyl alcohol and 0.01 g of glucose and 9.86 g DI water, dried to give a dry coatweight of ca. 0.01 gsm. A higher coatweight was achieved by coating a solution comprising 0.26 g of polyvinyl alcohol and 0.02 g of glucose and 9.72 g DI water, dried to give a dry coatweight of ca. 0.1 gsm Plates based on examples 28 and present example 32 were then stored at 30C and 85% relative humidity for 5 days. These plates were then imaged using infrared exposure of 325 mJ/cm2 at 17.4 Watts. The imaged plate was mounted onto a press, dampened with fountain solution for 30 seconds before the ink was applied to the plate. The number of printed sheets required to give a clean background on the printed sheet was noted as well as the tendency towards plugging of the shadows and the print quality of the plate are summarized in the Table 4.

TABLE 4

| Example number | Topcoat coatweight (gsm) | Aged at 30 C. @85% RH 5 days | Number of copies to obtain a clean background on the printed sheet | Plugging of the shadows | Presence of 2% dots at 240 lpi imaged at 325 mJ/cm2 |
|---|---|---|---|---|---|
| 28 | None | No | $\leqq$10 | No | Complete |
| 28 | None | Yes | 50 | Yes | Complete |
| 32 | ca. 0.01 | Yes | <10 | No | Complete |
| 32 | ca. 0.1 | Yes | <10 | No | Incomplete |

Example 33

34.8 g of the latex of example 28 was mixed with 11.8 g of 2% acetic acid and 3.4 g of 1-methoxy-2-propanol containing 2.8% IR dye and 0.84% of a wetting agent and 0.025% glyoxal when coated on a grained and anodized aluminum substrate, dried to give a dry coatweight of ca. 1. 8 gsm, a second layer was then applied by coating from a solution comprising 0.11 g of polyvinyl alcohol and 0.14 g of gum arabic and 9.75 g DI water, dried to give a dry coatweight of ca. 0.01 gsm. A higher topcoat coat weight was achieved by coating a solution comprising 0.229 of polyvinyl alcohol and 0.28 g of gum arabic and 9.5 g DI water, dried to give a dry coatweight of ca. 0.1 gsm Plates based on examples 30, 31, 32 and present example 33 were then stored at 30C and 85% relative humidity for 5 days. These plates were then imaged using infrared exposure of 325 mJ/cm2 at 17.4 Watts. The imaged plate was mounted onto a press, dampened with fountain solution for 30 seconds before the ink was applied to the plate. The run length performance is summarized in Table 5.

TABLE 5

| Example number | Topcoat coatweight (gsm) | Aged at 30 C. @85% RH 5 days | Number of copies to obtain a clean background on the printed sheet | Plugging of the shadows | Run length |
|---|---|---|---|---|---|
| 28 | None | No | $\leqq$10 | No | >30,000 |
| 30 | ca. 0.1 | Yes | <10 | No | >30,000 |
| 31 | ca. 0.01 | Yes | <10 | No | >30,000 |
| 32 | ca. 0.01 | Yes | <10 | No | >30,000 |
| 33 | ca. 0.01 | Yes | <10 | No | >30,000 |

There have thus been outlined the important features of the invention in order that it may be better understood, and in order that the present contribution to the art may be better appreciated. Those skilled in the art will appreciate that the conception on which this disclosure is based may readily be utilized as a basis for the design of other compositions, elements and methods for carrying out the several purposes of the invention. It is most important, therefore, that this disclosure be regarded as including such equivalent compositions, elements and methods as do not depart from the spirit and scope of the invention.

What is claimed is:

1. A processless radiation-imageable lithographic printing precursor comprising a substrate, a dried and aqueous-ineluable coating of a radiation-sensitive medium on the substrate and an aqueous eluable hydrophilic overcoat over the coating of a radiation-sensitive medium, the radiation-sensitive medium comprising a hydrophilic polymer that is a chitosan polymer, and a plurality of particles of at least one copolymer of a hydrophobic monomer and a monomer that has a carboxylic acid group, wherein the dried and aqueous-ineluable coating is capable of becoming hydrophobic under the action of heat, wherein said particles comprise a core that is predominantly hydrophobic polymer derived from said hydrophobic monomer and the remainder of said particles is predominantly hydrophilic polymer derived from said monomer having a carboxylic acid group.

2. The precursor of claim 1, wherein the aqueous eluable hydrophilic overcoat comprises a water-soluble organic polymer.

3. The precursor of claim 2, wherein the water-soluble organic polymer is at least one of polyvinylalcohol, polyvinylacetate, polyacrylic acid, poly(meth)acrylic acid, an alkali metal salt of poly(meth)acrylic acid, an amine salt of poly (meth)acrylic acid, poly 2-hydroxyethyl(meth)acrylate, poly (meth)acrylamide, polyvinyl methyl ether, polyvinyl methyl ether/maleic anhydride copolymer, polyvinylpyrollidone, poly-2-acrylantde-2-methylpropane sulfonic acid, an alkali metal salt of poly-2-acrylamide-2-methyipropane sulfonic acid, an amine salt of poly-2-acrylaniide-2-methylpropane sulfonic acid, alginic acid, a salt of alginic acid, protan jelly, carageenin, tragacanth, laniinarmn sulfate, starch, animal glues, vegetable mucilages, gum arabic, cellulose, a modification product of cellulose and a polysaccharide.

4. The precursor of claim 2, wherein the overcoat further comprises at least one of a radiation-to-heat converting agent, a water-soluble dye, a colorant and a surfactant.

5. The precursor of claim 4, wherein the radiation-to-heat converting agent is hydrophobic.

6. The precursor of claim 1, that is sensitive to infrared radiation.

7. The precursor of claim 6, wherein the infrared radiation has wavelength between 700 nm and 1200 nm.

8. A method for making a negative-working lithographic printing master, the method consisting essentially of, in the order stated, imagewise irradiating the processless radiation-imageable lithographic printing precursor of claim 1 with imaging radiation and treating the precursor with an aqueous medium.

9. A processless radiation-imageable lithographic printing precursor comprising a substrate, a dried and aqueous-ineluable coating of a radiation-sensitive medium on the substrate and an aqueous eluable hydrophilic overcoat over the coating of a radiation-sensitive medium, the radiation-sensitive medium comprising hydrophilic polymer particles, the hydrophilic particles being a. hydrophilic to a substantial depth, with only a core region of the particles being hydrophobic, and b. comprised of a chitosan polymer and at least one copolymer of a hydrophobic monomer and a monomer that has a carboxylic acid group that is capable of bonding with the amine groups of the chitosan polymer, wherein the dried and aqueous-ineluable coating is capable of becoming hydrophobic under the action of heat.

10. The precursor of claim 9, wherein the aqueous eluable hydrophilic overcoat comprises a water-soluble organic polymer.

11. The precursor of claim 10, wherein the water-soluble organic polymer is at least one of polyvinylalcohol, polyvinylacetate, polyacrylic acid, poly(meth)acrylic acid, an alkali metal salt of poly(meth)acrylic acid, an amine salt of poly (meth)acrylic acid, poly 2-hydroxyethyl(meth)acrylate, poly (meth)acrylamide, polyvinyl methyl ether, polyvinyl methyl ether/maleic anhydride copolymer, polyvinylpyrollidone, poly-2-acrylamide-2-methylpropane sulfonic acid, an alkali metal salt of poly-2-acrylamide-2-methyipropane sulfonic acid, an amine salt of poly-2-acrylamide-2-methylpropane sulfonic acid, alginic acid, a salt of alginic acid, protan jelly, carageenin, tragacanth, laminarin sulfate, starch, animal glues, vegetable mucilages, gum arabic, cellulose, a modification product of cellulose and a polysaccharide.

12. The precursor of claim 10 wherein the dried and aqueous-ineluable coating is capable of becoming hydrophobic under the action of infrared radiation.

13. The precursor of claim 12, wherein the infrared radiation has wavelength between 700 nm and 1200 nm.

14. The precursor of claim 9, wherein the overcoat further comprises at least one of a radiation-to-heat converting agent, a water-soluble dye, a colorant and a surfactant.

15. The precursor of claim 14, wherein the radiation-to-heat converting agent is hydrophobic.

16. A method for making a negative-working lithographic printing master, the method consisting essentially of, in the order stated, imagewise irradiating the processless radiation-imageable lithographic printing precursor of claim 9 with imaging radiation and treating the precursor with an aqueous medium.

17. A processless radiation-imageable lithographic printing precursor comprising a substrate, a dried and aqueous-ineluable coating of a radiation-sensitive medium on the substrate and an aqueous eluable hydrophilic overcoat over the coating of a radiation-sensitive medium, the radiation-sensitive medium comprising a hydrophilic polymer containing an amine group, and at least one particulate copolymer of a hydrophobic monomer and a monomer that has a carboxylic group, the precursor further comprising at least one radiation-to-heat converting agents, and the hydrophilic polymer is a chitosan polymer, wherein the dried and aqueous-ineluable coating is capable of becoming hydrophobic under the action of infrared radiation, wherein said particles comprise a core that is predominantly hydrophobic polymer derived from said hydrophobic monomer and the remainder of said particles is predominantly hydrophilic polymer derived from said monomer having a carboxylic acid group.

18. A processless radiation-imageable lithographic printing precursor comprising a substrate, a dried and aqueous-ineluable coating of a radiation-sensitive medium on the substrate and an aqueous eluable hydrophilic overcoat over the coating of a radiation-sensitive medium, the radiation-sensitive medium comprising a hydrophilic polymer that is a chitosan polymer, and a continuous phase and particles of at least one thermally softenable copolymer of a hydrophobic monomer and a monomer that has a carboxylic acid group, wherein the dried and aqueous-ineluable coating is capable of becoming hydrophobic under the action of heat, wherein said particles comprise a core that is predominantly hydrophobic polymer derived from said hydrophobic monomer and the remainder of said particles is predominantly hydrophilic polymer derived from said monomer having a carboxylic acid group.

* * * * *